United States Patent
Hsieh et al.

(10) Patent No.: US 11,482,993 B1
(45) Date of Patent: Oct. 25, 2022

(54) MITIGATING THE EFFECTS OF KICKBACK NOISE ON A COMPARATOR

(71) Applicant: XILINX, INC., San Jose, CA (US)

(72) Inventors: Kai-An Hsieh, Tainan (TW); Tan Kee Hian, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/183,176

(22) Filed: Feb. 23, 2021

(51) Int. Cl.
*H03K 5/24* (2006.01)
*H03H 7/38* (2006.01)
*H03H 7/06* (2006.01)

(52) U.S. Cl.
CPC ............... *H03K 5/24* (2013.01); *H03H 7/06* (2013.01); *H03H 7/38* (2013.01)

(58) Field of Classification Search
None
See application file for complete search history.

(56) References Cited

U.S. PATENT DOCUMENTS

2017/0085131 A1* 3/2017 Liu .................. H03H 7/38
2021/0327680 A1* 10/2021 Kim ................. H03K 5/24

* cited by examiner

*Primary Examiner* — Cassandra F Cox
(74) *Attorney, Agent, or Firm* — Patterson + Sheridan, LLP

(57) ABSTRACT

Embodiments herein describe placing a filter network at one of the inputs of the comparator to avoid injecting unequal amounts of kickback noise into the inputs of the comparator. In one embodiment, the filter network matches the impedance seen at the inputs of the comparator. As a result, the amount of kickback noise is essentially equal at the inputs even though the input signals may be at different frequencies. Thus, the kickback noise is essentially cancelled out so that this noise has little to no impact on the output of the comparator.

20 Claims, 2 Drawing Sheets

US 11,482,993 B1

MITIGATING THE EFFECTS OF KICKBACK NOISE ON A COMPARATOR

GOVERNMENT RIGHTS

This invention was made with government support under PIPES initiative (BAA-HR001119S0004) awarded by the Defense Advanced Research Projects Agency. The government has certain rights in the invention.

TECHNICAL FIELD

Examples of the present disclosure generally relate to an impedance matching filter network for mitigating the effects of kickback noise on a comparator.

BACKGROUND

Comparators are commonly used in devices (e.g., integrated circuits or on printed circuit boards PCBs) that measure and digitize analog signals. Generally, comparators generate an output based on a difference between its inputs. During a sampling or reset operation, kickback noise is injected into the inputs of the comparator. However, for most applications the kickback noise is equal at both inputs. Thus, when comparing the inputs, the kickback noise generally cancels out and has little or no effect on the output of the comparator.

SUMMARY

One embodiment describes a circuit that includes a comparator configured to receive a first signal at a first input and a second signal at a second input. Moreover, a frequency of the first signal is different than a frequency of the second signal. The circuit also includes a passive filter network connected to one of the first or second inputs, where the passive filter network is configured to perform impedance matching such that an impedance seen from a perspective of the first input of the comparator matches an impedance seen from a perspective of the second input of the comparator.

Another embodiment described herein is a circuit that includes a comparator, a first driver with an output connected to a first input of the comparator, a second driver with an output connected to a second input of the comparator where the first and second drivers have different output impedances, and a passive filter network connected to one of the first or second inputs. Moreover, the passive filter network is configured to perform impedance matching such that an impedance seen from a perspective of the first input matches an impedance seen from a perspective of the second input.

Another embodiment described herein is a method that includes identifying a kickback noise frequency corresponding to a comparator, selecting a capacitance for a filter network that generates an AC ground at the kickback noise frequency, selecting a resistance for the filter network to perform impedance matching at the inputs of the comparator, and placing the filter network on an input path of the comparator.

BRIEF DESCRIPTION OF DRAWINGS

So that the manner in which the above recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
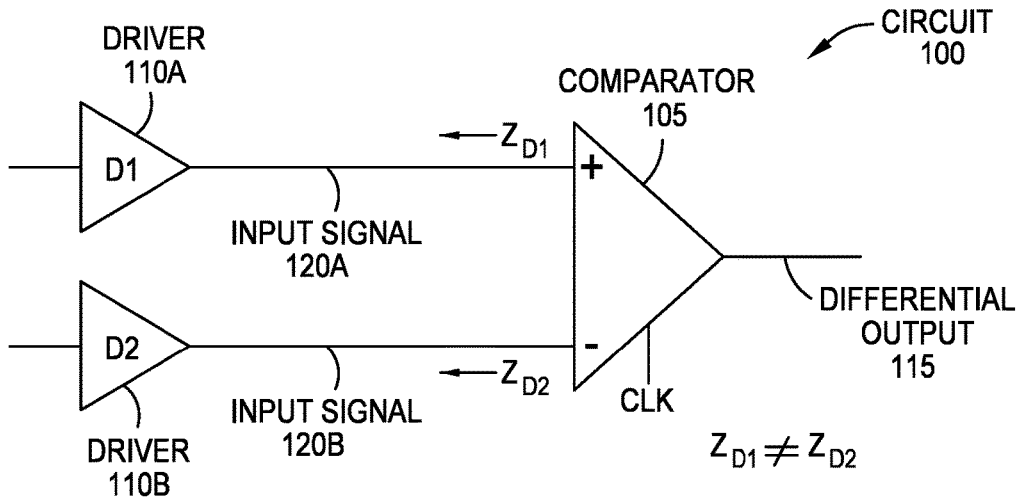
FIG. 1 is a circuit diagram of a comparator with unequal kickback noise at its inputs, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe placing a filter network at one of the inputs of the comparator to avoid injecting unequal amounts of kickback noise into the inputs of the comparator. For applications that provide input signals to a comparator that have substantially equal frequencies, the kickback noise injected to the inputs of the comparator is generally the same. However, other applications may provide input signals with different frequencies, and as a result, the kickback noise injected to the inputs may be different. Thus, when comparing the input signals, the kickback noise is not cancelled out and can affect the output of the comparator. Put differently, when the kickback noise is unequal, the output of the comparator can be effected by this noise.

To mitigate or prevent the kickback noise from affecting the output of the comparator, the embodiments herein use a filter network that equalizes the impedance seen at the inputs of the comparator. As a result, the amount of kickback noise is essentially equal at the inputs even though the input signals are different frequencies. Thus, the kickback noise is essentially cancelled out so that this noise has little to no impact on the output of the comparator.

FIG. 1 is a circuit diagram of a comparator 105 with unequal kickback noise at its inputs, according to an example. That is, FIG. 1 illustrates a circuit 100 that includes drivers 110A and 110B that provide input signals 120A and 120B, respectively, to the comparator 105. The comparator 105 can then generate a output 115 (e.g., either a single ended or differential output) using a clock signal (CLK) by comparing the inputs 120. The embodiments herein are not limited to any particular type of comparator 105 or driver 110. That is, the embodiments described below may be useful for a wide variety of comparator 105 applications.

In the embodiments and examples that follow, it is assumed that the input signals 120 have different frequencies. For example, the input signal 120A may be a highfrequency data signal while the input signal 120B is a static voltage signal (e.g., a DC voltage). In other embodiments, the input signal 120B may also be a modulated input signal, although at a lower frequency than the input signal 120A. Thus, the input signal 120A is generally described as a higher-frequency signal while the input signal 120B is described as a lower-frequency signal. Using different frequency input signals may be useful in several applications, such as a single ended system (e.g., an optical serial link) where the comparator 105 is used to convert the input signals into digitized signals.

To generate signals with different frequencies, the drivers 110A and 110B may have different circuit designs. That is, the driver 110A is not the same as the driver 110B. As a result, the output impedance of the driver 110A (i.e., $Z_{D1}$) is different from the output impedance of the driver 110B (i.e., $Z_{D2}$). This difference in driver output impedance, as seen by the inputs of the comparator 105, causes different amounts of kickback noise to be injected into the inputs of the comparator 105 which induces a differential noise being added to the inputs of the comparator 105 which can affect the output 115. In one embodiment, during an edge of the CLK signal, the voltage swing in the comparator 105 "kicks back" to the input which injects the kickback noise into the inputs. Because this kickback noise is unequal, this difference can affect the output 115 since the circuit 100 is a differential system.

While having different drivers 110A and 110B can result in the different driver output impedances $Z_{D1}$ and $Z_{D2}$ and cause unequal kickback noise at the inputs of the comparator 105, the inputs of the comparator 105 may see different output impedances when the drivers 110 are the same. That is, in some examples, the circuitry of the drivers 110A and 110B may be the same, but use different settings to generate input signals 120 with different frequencies. In those examples, the kickback noise may still be unequal at the inputs of the comparator 105 which can have a negative impact on the output 115. Thus, the embodiments herein may be useful in any differential system where the inputs to a comparator have different frequencies. In contrast, many applications that use comparators provide input signals that are essentially the same frequency but are inverted (e.g., one input signal is 180 degrees offset from the other input signal). The driver output impedances in these situations are essentially the same, so that there is no differential kickback noise injected into the comparator inputs.

Figure 2:
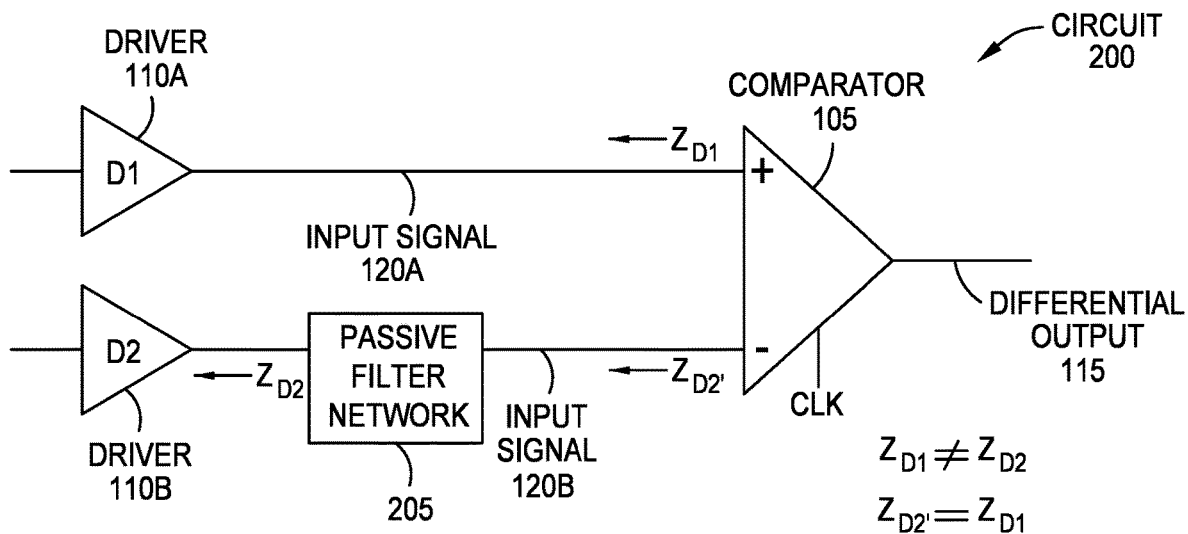
FIG. 2 illustrates a passive filter network for mitigating the effects of kickback noise on the input of a comparator, according to an example.

FIG. 2 illustrates a circuit 200 with a passive filter network 205 for mitigating the effects of kickback noise on the output 115 of the comparator 105, according to an example. Like in FIG. 1, FIG. 2 assumes that the input signals 120 have different frequencies which would result in unequal amounts of kickback noise being injected into the inputs of the comparator 105. However, to prevent this, the circuit 200 includes the passive filter network 205 that ensures the impedances (at the frequency of the kickback noise) seen at the inputs of the comparator 105 match. As a result, the amount of kickback noise at the inputs is essentially the same, and thus has little to no effect on the output 115.

In FIG. 2, the output impedances $Z_{D1}$ and $Z_{D2}$ of the drivers 110A and 110B are not the same. As a result, without the passive filter network, the impedances seen at the inputs of the comparator 105 would not be equal (like in the example shown in FIG. 1). However, the negative input sees an impedance of both the passive filter network and the driver 110B (i.e., the impedance $Z_{D2}$). The circuit components in the passive filter network 205 can be selected so the impedance $Z_{D2}$ (at the frequency of the kickback noise) seen at the negative input of the comparator 105 is substantially equal to the impedance $Z_{D1}$ (at the frequency of the kickback noise) seen at the positive input of the comparator 105. The details of the passive filter network 205 are described in more detail in the figures below. But in general, the passive filter network 205 can include any number and types of passive components (e.g., resistor, capacitors, inductors, etc.) that can equalize the impedances seen at the inputs of the comparator 105.

In one embodiment, the circuit 200 is part of an integrated circuit (IC) (e.g., a silicon chip). That is, the comparator 105, drivers 110, and passive filter network 205 may be components in an IC. In other embodiments, some of the components may be in an IC while other components are external, but electrically connected, to the IC. For example, the drivers 110 and comparator 105 may be integrated into an IC while one or more components of the passive filter network 205 (e.g., a capacitor or resistor) are external to the IC. However, in other embodiments, the circuit 200 is formed from discrete circuit components that may be mounted on a common substrate (e.g., PCB).

Further, while the in some embodiments the circuitry or designs of the drivers 110A and 110B may be different (in order to generate inputs signals 120 with difference frequencies), in other embodiments the drivers 110 may have the same circuitry components. In general, the passive filter network 205 can be used to avoid the negative impact of unequal kickback noise in any circuit where different frequency input signals 120 are used.

Figure 3:
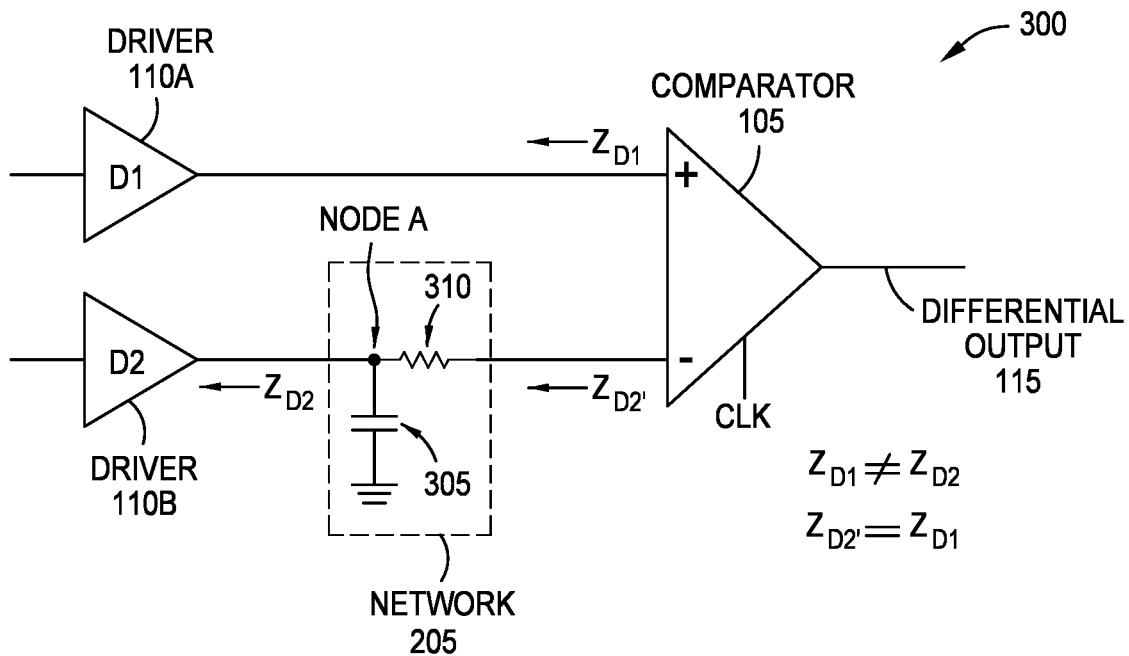
FIG. 3 illustrates a RC network for mitigating the effects of kickback noise on the input of a comparator, according to an example.

FIG. 3 illustrates a circuit 300 with a RC network for mitigating the effects of kickback noise on the output 115 of the comparator 105, according to an example. That is, FIG. 3 illustrates one exemplary design of the passive filter network 205 in FIG. 2. However, the embodiments herein are not limited to the design in FIG. 3 but can be used with any passive filter network (which can have a combination of resistors, capacitors, etc.) that avoid differential kickback noise at the inputs of the comparator 105.

As shown, the network 205 includes a capacitor 305 with a first end coupled to Node A, which is also coupled to an output of the driver 110B. A second end of the capacitor 305 is coupled to ground (or a reference voltage).

The filter network 205 also includes a resistor 310 that is coupled at a first end to Node A and is coupled at a second end to a negative input of the comparator 105.

During operation, the capacitor 305 operates as an AC ground at the frequency (or frequencies) of the kickback noise, which bypasses the output impedance $Z_{D2}$ of the driver 110B. The value of the resistor 310 is selected so that the impedance $Z_{D2}$ seen at the negative input of the comparator 105 is the same (or very similar) to the output impedance $Z_{D1}$ of the driver 110A as seen by the positive input of the comparator 105. In this manner, at the frequencies of the kickback noise, the impedances $Z_{D2}$ and $Z_{D1}$ at the inputs of the comparator 105 are essentially the same (i.e., impedance matched), ensuring that any kickback noise injected at the inputs is the same. As a result, the kickback noise has little to no effect on the output 115.

In one embodiment, the passive filter network 205 is placed on the input of the comparator 105 that receives the lower frequency signal (input signal 120B in this example). That way, the network 205 does not have a negative impact on the higher frequency input signal, which may be transmitting data or other modulated information.

The capacitor 305 and resistor 310 in the filter network 205 can be implemented using any known technique. For example, the capacitor 305 and resistor 310 may be discrete components, or one of these circuit components may be a discrete component while another is implemented in an IC. If the resistor 310 is integrated into an IC, it can be implemented as a metal resistor, poly resistor, or transistor resistor. If the capacitor 305 is integrated into an IC, it can be implemented using a metal capacitor, transistor capacitor, or parasitic capacitance on routing lines (e.g., the metal routing lines connecting the driver 110B to the comparator 105).

Moreover, the circuit 300 can be repeated with multiple comparators in parallel. In that example, each comparator can include a passive filter network that is designed to perform impedance matching at its inputs. In one embodiment, these passive filter networks may be disposed on the lower-frequency inputs of the comparators.

Figure 4:
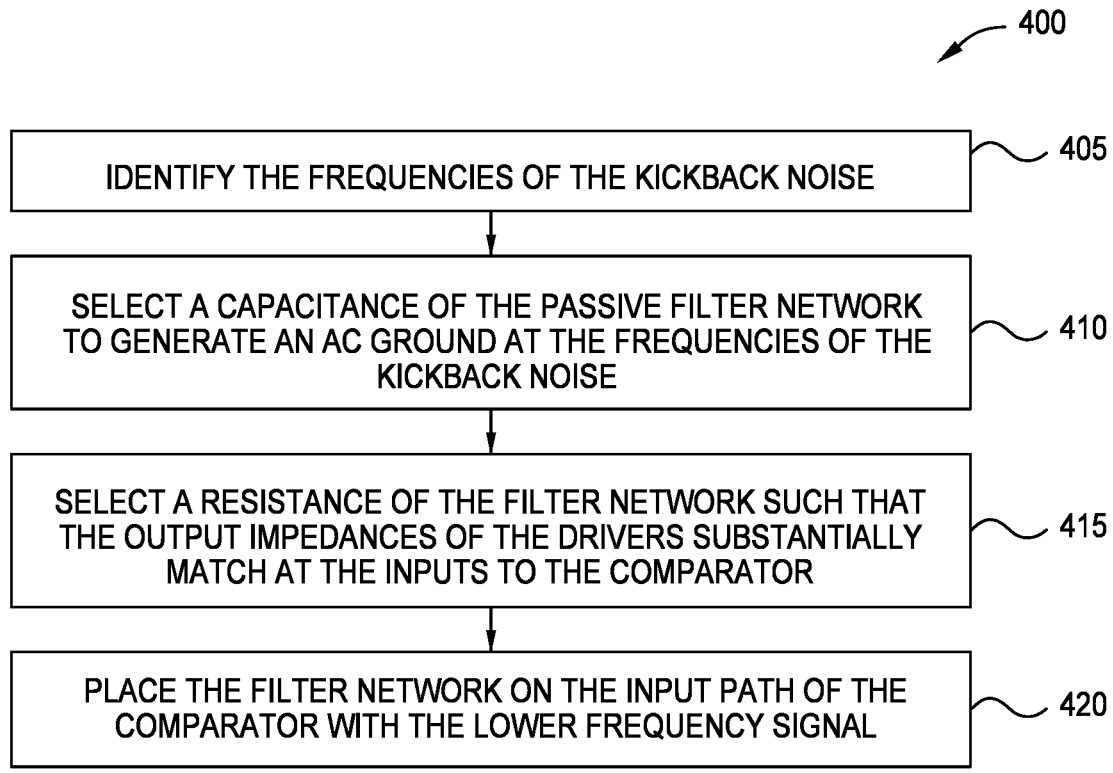
FIG. 4 is a flowchart for designing a filter network for mitigating the effects of kickback noise on the input of a comparator, according to an example.

FIG. 4 is a flowchart of a method 400 for designing a filter network for mitigating the effects of kickback noise on a comparator, according to an example. In one embodiment, the method 400 is performed by a circuit designer or technician. In another embodiment, the method 400 is performed by a circuit design application (e.g., a software application) without human intervention.

At block 405, the frequencies of the kickback noise is identified. In one embodiment, the kickback noise may occur at a range of frequencies, or primarily at a single frequency. In one embodiment, the frequency of the kickback noise is related to the frequency of the clock signal provided to the comparator. For example, the kickback noise may have a similar frequency as the clock signal, or may have a frequency that is a multiple of the clock frequency.

At block 410, a capacitance of the passive filter network is selected to be an AC ground at the frequencies of the kickback noise. For example, the circuit designer or application may select a value of the capacitor 305 in FIG. 3 so that Node A is an AC ground at the frequencies of the kickback noise.

At block 415, a resistance of the filter network is selected such that the output impedances of the drivers, as seen from the perspective of the inputs of the comparator, substantially match. This resistance value can then be used to select the resistor 310 in FIG. 3 which couples to Node A on a first end and to the comparator 105 on a second end.

At block 420, the filter network is placed on the input path of the comparator with the lower frequency signal. That is, a filter network designed to have the capacitance and resistance values selected at block 410 and 415 is disposed between an input of the comparator and the driver that generates the lower frequency input signal. This passive filter network matches the impedances of the output drivers from the perspective of the comparator inputs. Since these impedances are the same, any kickback noise generated by the circuit is substantially the same at both inputs of the comparator. As a result, the noise cancels out and has little to no effect on the output of the comparator.

In one embodiment, placing the filter network at block 420 includes arranging and electrically connecting discrete circuit components so they connect to form a differential system. In another embodiment, placing the filter network includes forming the passive filter network in an integrated circuit, or, if some of the components are in an IC but others are not, electrically coupling the components of the filter network in the IC with components that are external to the IC.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A circuit, comprising:
   a comparator configured to receive a first signal at a first input and a second signal at a second input, wherein a frequency of the first signal is different than a frequency of the second signal; and
   a passive filter network connected to one of the first or second inputs, wherein the passive filter network is configured to perform impedance matching such that an impedance seen from a perspective of the first input of the comparator matches an impedance seen from a perspective of the second input of the comparator.

2. The circuit of claim 1, wherein the first signal has a frequency that is greater than the frequency of the second signal, and wherein the passive filter network is connected to the second input, and wherein the passive filter network performs impedance matching at a kickback noise frequency.

3. The circuit of claim 2, further comprising:
   a first driver connected to the first input and configured to generate the first signal; and
   a second driver connected to the second input and configured to generate the second signal, wherein the passive filter network is coupled between the second driver and the second input.

4. The circuit of claim 3, wherein there is no passive filter network disposed between the first driver and the first input.

5. The circuit of claim 3, wherein the first and second drivers have different output impedances.

6. The circuit of claim 3, wherein the comparator, the passive filter network, the first driver, and the second driver are disposed in an integrated circuit.

7. The circuit of claim 1, wherein the passive filter network comprises:
   a capacitor coupled to a first node at a first end and to ground at a second end; and
   a resistor coupled to the first node at a first end and to the second input at a second end.

8. The circuit of claim 7, further comprising:
   a driver configured to generate the second signal, wherein an output of the driver is coupled to the first node such that the resistor is connected in series between the output of the driver and the second input of the comparator.

9. The circuit of claim 7, wherein the capacitor has a value such that the first node is an AC ground at a kickback noise frequency.

10. A circuit comprising:
    a comparator;
    a first driver with an output connected to a first input of the comparator;
    a second driver with an output connected to a second input of the comparator, wherein the first and second drivers have different output impedances; and
    a passive filter network connected to one of the first or second inputs, wherein the passive filter network is configured to perform impedance matching such that an impedance seen from a perspective of the first input matches an impedance seen from a perspective of the second input.

11. The circuit of claim 10, wherein the first driver is configured to output a first signal with a frequency that is greater than the frequency of a second signal output by the second driver, and wherein the passive filter network is connected between the second driver and the second input, and wherein the passive filter network performs impedance matching at a kickback noise frequency.

12. The circuit of claim 10, wherein there is no passive filter network disposed between the first driver and the first input.

13. The circuit of claim 10, wherein the comparator, the passive filter network, the first driver, and the second driver are disposed in an integrated circuit.

14. The circuit of claim 10, wherein the passive filter network comprises:
- a capacitor coupled to a first node at a first end and to ground at a second end; and
- a resistor coupled to the first node at a first end and to the second input at a second end.

15. The circuit of claim 14, wherein the output of the second driver is coupled to the first node such that the resistor is connected in series between the output of the second driver and the second input of the comparator.

16. The circuit of claim 14, wherein the capacitor has a value such that the first node is an AC ground at a kickback noise frequency.

17. A method, comprising:
- identifying a kickback noise frequency corresponding to a comparator;
- selecting a capacitance for a filter network that generates an AC ground at the kickback noise frequency;
- selecting a resistance for the filter network to perform impedance matching at the inputs of the comparator; and
- placing the filter network on an input path of the comparator.

18. The method of claim 17, wherein the kickback noise comprises a range of frequencies.

19. The method of claim 17, wherein the filter network is disposed on the input path of the comparator that receives a lower frequency input signal than another input signal of the comparator.

20. The method of claim 17, wherein the filter network comprises:
- a capacitor coupled to a first node at a first end and to ground at a second end; and
- a resistor coupled to the first node at a first end and to the comparator at a second end,
- wherein an output of a driver is coupled to the first node such that the resistor is connected in series between the driver and the comparator.

* * * * *